(12) United States Patent
Wu

(10) Patent No.: US 8,890,326 B2
(45) Date of Patent: Nov. 18, 2014

(54) EASILY ASSEMBLED CHIP ASSEMBLY AND CHIP ASSEMBLING METHOD

(75) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 30 days.

(21) Appl. No.: 13/559,622

(22) Filed: Jul. 27, 2012

(65) Prior Publication Data

US 2013/0285243 A1    Oct. 31, 2013

(30) Foreign Application Priority Data

Apr. 27, 2012   (TW) .................................. 101115017

(51) Int. Cl.
   *H01L 23/48*   (2006.01)

(52) U.S. Cl.
   USPC .................................. 257/774; 257/E23.011

(58) Field of Classification Search
   CPC .................................................... H01L 23/4828
   USPC .......................................................... 257/753
   See application file for complete search history.

(56) References Cited

U.S. PATENT DOCUMENTS

| | | | | |
|---|---|---|---|---|
| 5,438,478 A * | 8/1995 | Kondo et al. | ................. | 257/698 |
| 7,186,925 B2 * | 3/2007 | Tsukahara et al. | ............. | 257/737 |
| 7,274,094 B2 * | 9/2007 | Boon et al. | .................... | 257/680 |

* cited by examiner

*Primary Examiner* — Chandra Chaudhari
(74) *Attorney, Agent, or Firm* — Novak Druce Connolly Bove + Quigg LLP

(57) ABSTRACT

A chip assembly includes a PCB, a connecting pad fixed on the PCB, and a chip. The connecting pad defines a through hole. The chip is received in the through hole and fixed on the PCB by an adhesive distributed in the through hole. A thickness of the adhesive is less than that of the connecting pad.

5 Claims, 3 Drawing Sheets

EASILY ASSEMBLED CHIP ASSEMBLY AND CHIP ASSEMBLING METHOD

BACKGROUND

1. Technical Field

The present disclosure relates to a chip assembly and a method for assembling the chip assembly.

2. Description of Related Art

Optical couplers include a substrate, a laser diode, and a shell forming with a lens. The laser diode and the shell are positioned on the substrate. The shell covers the laser diode and it is required that the laser diode align with the lens such that the laser diode can emit laser beams out of the optical coupler via the lens. In assembly, the laser diode is placed on a preset position and the shell is placed on another preset positioned to achieve the alignment between the laser diode and the lens. However, the laser diode is typically fixed to the PCB by curable adhesive, and before the curable adhesive is totally solidified the laser diode may slide away from the preset position, breaking the alignment.

What is needed therefore is a chip assembly and a chip assembling method addressing the limitations described.

BRIEF DESCRIPTION OF THE DRAWINGS

The components of the drawings are not necessarily drawn to scale, the emphasis instead being placed upon clearly illustrating the principles of the embodiments of the present disclosure. Moreover, in the drawings, like reference numerals designate corresponding parts throughout several views.

DETAILED DESCRIPTION

Figure 1:
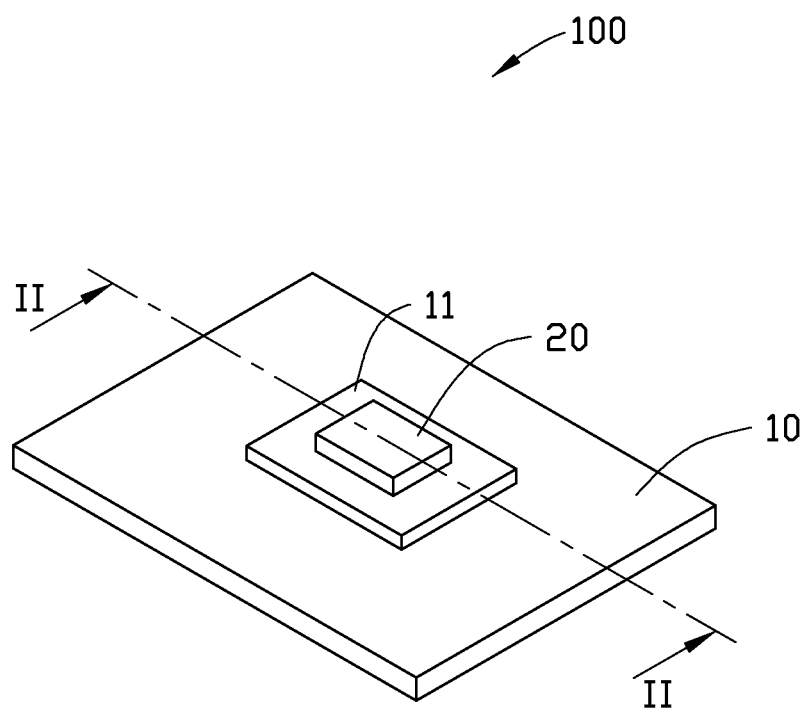
FIG. 1 is an isometric view of a chip assembly, according to an exemplary embodiment of the present disclosure.
Figure 2:
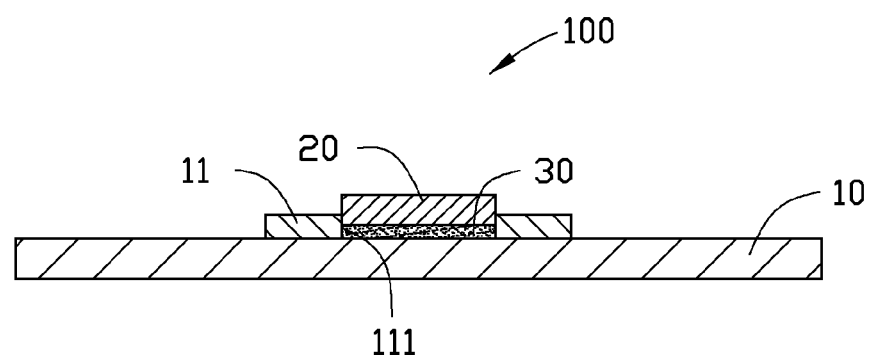
FIG. 2 is a cross-sectional view of the chip assembly of FIG. 1, taken along line II-II.

Referring to FIGS. 1-2, a chip assembly 100, according to an exemplary embodiment, is shown. The chip assembly 100 includes a printed circuit board (PCB) 10 and a chip 20 positioned on the PCB 10. The chip assembly 100 can be employed in an optical coupler (not shown), and the chip 20 can be a photodiode (PD), a laser diode (LD), or a driver.

The PCB 10 is configured for supporting the chip 20 and providing power and signal transmitting paths for the chip 20. The PCB 10 includes a connecting pad 11. The connecting pad 11 is fixed at a predetermined position of the PCB 10. The connecting pad 11 defines a through hole 111. A position of the through hole 111 on the PCB 10 is corresponding to a mounting position of the chip on the PCB 10. A shape and size of the through hole 111 correspond to a shape and size of the chip 20, respectively. The connecting pad 11 is made from metal. In the embodiment, the connecting pad 11 is made from copper.

The chip 20 is received in the through hole 111 and fixedly connected to the PCB by an adhesive 30. A thickness of the adhesive 30 is less than that of the connecting pad 11. The adhesive 30 can be ultraviolet (UV) curable adhesive or thermal curable adhesive. In the embodiment, the adhesive 30 is UV curable adhesive.

The chip 20 may has a grounding end (not shown), and the grounding end can be connected to the connecting pad 11.

FIG. 1 only shows a chip 20 positioned on the PCB 10. However, the number of the chip on the PCB can be more than one, and the chips may have different functions. For example, in an optical coupler, it may include a PD, a LD, and a driver.

Figure 3:
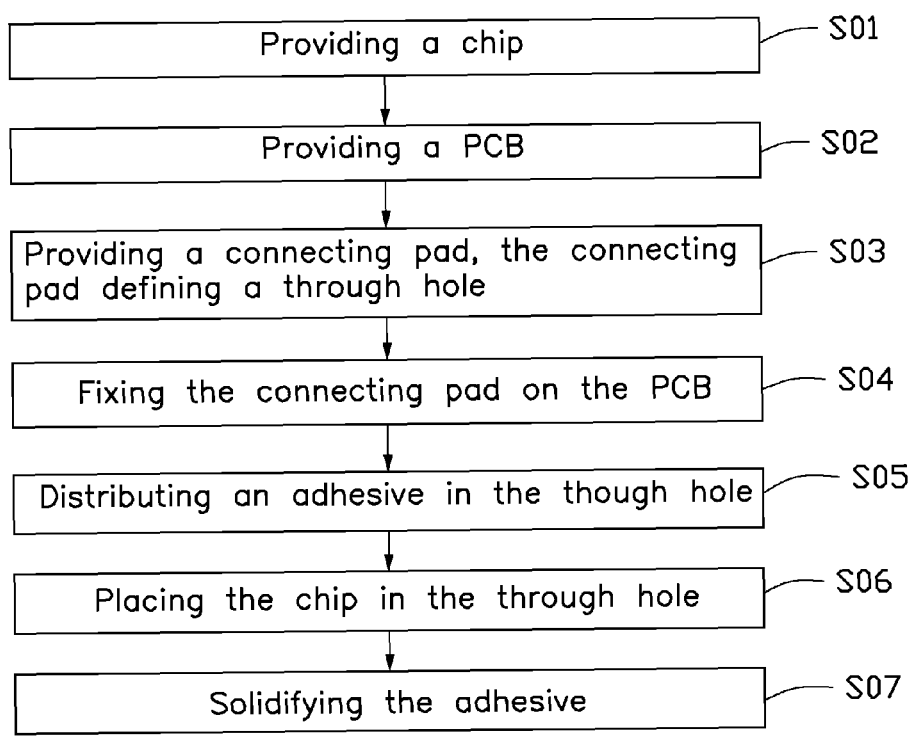
FIG. 3 is a flowchart of a chip assembling method, according to another exemplary embodiment of the present disclosure.

Referring to FIG. 3, an embodiment of a chip assembling method is show. The chip assembling method includes the following steps.

In step S01, a chip is provided.

In step S02, a PCB is provided.

In step S03, a connecting pad is provided. The connecting pad defines a through hole, a shape and size of the through hole are corresponding to a shape and size of the chip, respectively.

In step S04, the connecting pad is fixed on a surface of the PCB, the position of through hole on the PCB is corresponding to a predetermined mounting position of the chip.

In step S05, a curable adhesive is distributed on a portion of the PCB exposed in the through hole. A thickness of the adhesive is less than that of the connecting pad.

In step S06, the chip is received in the through hole.

In step S07, the adhesive is solidified to fixedly connect the chip to the PCB.

The chip assembly and the chip assembling method for the chip assembly employ a connecting pad defining a through hole, distribute an adhesive in the through hole, and fix the chip on the PCB by the adhesive. Therefore, the chip can be precisely mounted at a predetermined position on the PCB. Furthermore, because the thickness of the adhesive is less than the thickness of the connecting pad, thus overflow of the adhesive during the mounting process of the chip is avoided.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A chip assembly, comprising:
    a PCB;
    a connecting pad fixed on the PCB, the connecting pad defining a through hole; and
    a chip received in the through hole and fixed on the PCB by an adhesive distributed in the through hole, a thickness of the adhesive is less than a thickness of the connecting pad.

2. The chip assembly of claim 1, wherein a shape and size of the through hole are corresponding to a shape and size of the chip, respectively.

3. The chip assembly of claim 1, wherein the connecting pad is made from metal.

4. The chip assembly of claim 3, wherein the connecting pad is made from copper.

5. The chip assembly of claim 1, wherein the adhesive selected from the group consisting of UV curable adhesive and thermal curable adhesive.

* * * * *